United States Patent [19]

Roza

[11] Patent Number: 4,864,640
[45] Date of Patent: Sep. 5, 1989

[54] DIRECTLY MIXING SYNCHRONOUS RECEIVER

[75] Inventor: Engel Roza, Eindhoven, Netherlands

[73] Assignee: U.S. Philips Corporation, New York, N.Y.

[21] Appl. No.: 115,461

[22] Filed: Oct. 30, 1987

[30] Foreign Application Priority Data

Nov. 7, 1986 [NL] Netherlands ................... 8602819

[51] Int. Cl.[4] .......................... H04B 1/16; H03L 7/00
[52] U.S. Cl. .................... 455/260; 455/265;
   455/255; 331/2; 331/50; 331/25
[58] Field of Search ............ 455/260, 255, 263, 264,
   455/265, 208, 209; 331/2, 25, 46, 47, 50, 55

[56] References Cited

U.S. PATENT DOCUMENTS

| 4,143,322 | 3/1979 | Shimamura | 455/209 X |
| 4,399,560 | 8/1983 | Watkinson | 331/2 X |
| 4,500,851 | 2/1985 | Sawa et al. | 331/2 |
| 4,517,531 | 5/1985 | Tan et al. | 455/260 X |
| 4,569,064 | 2/1986 | Collin et al. | 455/260 X |
| 4,631,499 | 12/1986 | Kasperkovitz | 455/260 X |
| 4,742,566 | 5/1988 | Nordholt et al. | 455/260 |

FOREIGN PATENT DOCUMENTS

2657170 6/1978 Fed. Rep. of Germany .
2130826 6/1984 United Kingdom .

*Primary Examiner*—Robert L. Griffin
*Assistant Examiner*—Ralph E. Smith
*Attorney, Agent, or Firm*—Edward W. Goodman

[57] ABSTRACT

Directly mixing synchronous receiver having an RF input (1) and a first signal path (S1) which is coupled thereto and which incorporates a first synchronous demodulator (3) and a first low-pass filter (4), and having a carrier regeneration circuit including a first phase-locked loop (Q) incorporating in a loop configuration a first phase detector (5) which is coupled to the RF input (1), a first loop filter (6) and a first voltage-controlled tuning oscillator (8) an output of which is coupled to the first phase detector (5), on the one hand, and to the first synchronous demodulator (3) via a phase shift circuit, on the other hand, for a direct demodulation of an RF reception signal to the frequency baseband. The local mixing carrier required for the direct synchronous demodulation should be accurately in phase or in antiphase with the carrier of a desired RF reception signal to be demodulated. To this end the phase shift circuit includes a second phase-locked loop (P) incorporating in a loop configuration a second phase detector (8) which is coupled to said output of the first voltage-controlled oscillator (7), a second loop filter (9) and a second voltage-controlled tuning oscillator (10) an output of which is coupled to the second phase detector (8), on the one hand, and to the first synchronous demodulator (3), on the other hand, the tuning of the first voltage-controlled tuning oscillator (7) being coupled with that of the second voltage-controlled tuning oscillator (10).

8 Claims, 2 Drawing Sheets

DIRECTLY MIXING SYNCHRONOUS RECEIVER

BACKGROUND OF THE INVENTION

The invention relates to a directly mixing synchronous receiver having an RF input and a first signal path which is coupled thereto, incorporating a first synchronous demodulator and a first low-pass filter, and having a carrier regeneration circuit comprising a first phase-locked loop incorporating in a loop configuration a first phase detector which is coupled to the first signal path, a first loop filter and a first voltage-controlled tuning oscillator an output of which is coupled to the first phase detector, on the one hand, and to the first synchronous demodulator via a phase shift circuit, on the other hand, for a direct demodulation of an RF reception signal to the frequency baseband.

A directly mixing synchronous receiver of this type is known per se from British Patent Application No. 2,130,826.

In the first synchronous demodulator of a directly mixing synchronous receiver of the type described above, the modulated carrier of a desired RF reception signal is mixed with a tunable local mixing carrier which is tuned to the frequency of the desired RF reception carrier. The modulation signal modulated on this desired RF reception carrier is thereby directly demodulated to the baseband. The baseband modulation signal thus obtained is selected in the first low-pass filter.

For a correct direct demodulation of the modulation signal, the local mixing carrier should not only be equal in frequency to the RF reception carrier of a desired RF reception signal within the tuning range of the receiver, but it should also be accurately in phase or in anti-phase therewith. The local mixing carrier is generally derived from the output signal of the first voltage-controlled tuning oscillator of the first phase-locked loop.

The first phase-locked loop provides an automatic frequency control or an automatic fine tuning so that an accurate tuning of the oscillator signal applied to the first phase detector, to the desired RF reception carrier is possible, even in the case of a comparatively inaccurate tuning operation. In the phase-locked condition of this loop, the two signals applied to the first phase detector, that is to say the desired RF reception carrier and the last-mentioned oscillator signal, are mutually equal in frequency and differ by 90° in phase with respect to each other. Due to this phase-quadrature relation with the RF reception carrier, the oscillator signal is not suitable for use as a local mixing carrier for the first synchronous demodulator.

To obtain a local mixing carrier which is phase-shifted by 90° with respect to the oscillator signal in the loop, the first voltage-controlled tuning oscillator of the known directly mixing synchronous receiver first supplies an auxiliary oscillator signal whose frequency, upon correct tuning to a desired RF reception carrier, is twice the frequency of this RF reception carrier. From this auxiliary oscillator signal said oscillator signal for the first phase detector is obtained, on the one hand, by halving the frequency of the auxiliary oscillator signal and, on the other hand, a local mixing carrier differing by 90° in phase with respect to the oscillator signal being derived by a 180° phase shift of said auxiliary oscillator signal in the phase shift circuit, followed by halving its frequency.

In the known directly mixing synchronous receiver the tuning range of the first voltage-controlled tuning oscillator should therefore be twice as high as the RF reception range. For use as a TV-receiver, the tuning range of the tuning oscillator should cover a frequency range of approximately 2×50 MHz to 2×960 MHz. Such tuning oscillators are costly and complicated and due to the high oscillator frequencies they introduce unwanted parasitic effects such as crosstalk which disturb a good signal processing.

To avoid such high oscillator frequencies it is known per se to provide the tuning oscillator with a transistor output stage having a capacitively loaded emitter output and a collector output so that the oscillator signals available at the two outputs are mutually in phase quadrature. However, in practice the phase quadrature relation obtained in this way is found to be frequency-dependent and particularly at high tuning frequencies this phase quadrature relation is lost.

SUMMARY OF THE INVENTION

It is an object of the invention to provide a directly mixing synchronous receiver which is suitable for the reception of normal radio and/or TV broadcasting signals in which a synchronous demodulation of a desired RF reception signal is effected with a local mixing carrier which is accurately in phase or in anti-phase with the carrier of the desired RF reception signal within the tuning range of the receiver.

According to the invention, a directly mixing synchronous receiver of the type described in the opening paragraph is therefore characterized in that the phase-shift circuit comprises a second phase-locked loop incorporating in a loop configuration a second phase detector which is coupled to said output of the first voltage-controlled oscillator, a second loop filter and a second voltage-controlled tuning oscillator an output of which is coupled, on the one hand, to the second phase detector and, on the other hand, to the first synchronous demodulator, the tuning of the first voltage-controlled tuning oscillator being coupled with that of the second voltage-controlled tuning oscillator.

A loop tandem comprising first and second phase-locked loops which are also mutually coupled via a connection between the voltage-controlled oscillator of the first loop and the phase detector of the second loop is known per se from U.S. Pat. No. 4,500,851. The known loop tandem is used for the regeneration of a binary input signal disturbed by noise and jitter.

The invention is based on the recognition that such a loop tandem is particularly suitable for a reliable regeneration of the carrier of analogue AM signals within a frequency and dynamic range as occurs in RF-AM reception signals in normal radio and TV broadcasting systems.

In contrast to the loop tandem known from the above-mentioned U.S. Pat. No. 4,500,851 the loop tandem in the directly mixing synchronous receiver according to the invention is not used for regenerating an entirely binary input signal, but for regenerating only the carrier of an RF-AM signal.

When using the measure according to the invention the oscillator signals of the two tuning oscillators are mutually equal in frequency and differ accurately by 90° in phase with respect to each other due to the supply of the oscillator signal of the first voltage-controlled tuning oscillator to the second phase detector, the mutual coupling of the tuning of the first and second tuning oscillators and the loop action of the second phase-locked loop. In the case of a correct tuning to a desired RF reception carrier, the oscillator signal of the first voltage-controlled tuning oscillator differs by 90° in phase with respect to this RF reception carrier, hence hereinafter referred to as quadrature mixing carrier, and the oscillator signal of the second voltage-controlled tuning oscillator differs by 90° in phase with respect to this quadrature mixing carrier, in other words, it is in phase or in anti-phase with the said RF reception carrier. A correct synchronous demodulation of the RF reception signal is effected in the first synchronous demodulator by means of the last-mentioned oscillator signal, herein-after also referred to as in-phase mixing carrier.

In a preferred embodiment the phase quadrature relation between the quadrature mixing carrier and the in-phase mixing carrier is improved.

Such a preferred embodiment is therefore characterized in that an output of the second loop filter is coupled to a control input of the first voltage-controlled tuning oscillator for a phase control of the first tuning oscillator which is oppositely directed to the phase control of the second tuning oscillator.

A further preferred embodiment is characterized in that an output of the first loop filter is coupled to a control input of the second voltage-controlled tuning oscillator for a phase control of the second tuning oscillator which has the same direction as the phase control of the first tuning oscillator.

The capture and hold behavior of the loop tandem is improved by this measure.

In a further preferred embodiment, the quadrature mixing carrier is used for demodulating a desired RF reception signal analogously to the demodulation method known from German Patent Application No. 26 57 170 laid open to public inspection. A very effective suppression of neighboring channels is obtained by means of this method.

To this end such a preferred embodiment is characterized by a second signal path in which said RF reception signal is directly quadrature-demodulated to the baseband by means of the oscillator signal of the first voltage-controlled tuning oscillator, and a subsequent selection in a second low-pass filter, said first and second low-pass filters being coupled to first and second modulators to which first and second auxiliary mixing carriers are applied, respectively, from a fixed oscillator circuit, the frequency of said carriers being higher than the highest frequency in the baseband modulation signal of the RF reception signal and the carriers being mutually in phase-quadrature, said two modulators being coupled to inputs of a superposition circuit for mutually adding or subtracting the output signals of the two modulators, said superposition circuit being coupled to a second synchronous demodulator to which one of said two auxiliary mixing carriers is applied, said second synchronous demodulator being connected to a baseband signal processing unit for applying the baseband modulation signal thereto.

A further preferred embodiment is characterized in that the first phase detector is arranged in the second signal path for said direct quadrature demodulation of the RF reception signal to the baseband and is coupled via the second low-pass filter to the first loop filter.

In this path the first phase detector also functions as a synchronous demodulator for the direct quadrature demodulation of the RF reception signal in the second signal path and the second signal path at least partly forms part of the first phase-locked loop.

Another preferred embodiment is characterized in that a bandpass filter is arranged between the superposition circuit and the second synchronous demodulator, which bandpass filter is coupled to a third synchronous demodulator to which the second auxiliary mixing carrier is applied, said third synchronous demodulator being arranged in the first phase-locked loop and being coupled to the first loop filter thereof.

In this preferred embodiment, the bandpass filter is not only used for the selection of the desired modulation signal to be demodulated in the second synchronous demodulator, but it also substantially determines, together with the first loop filter, the selectivity in the first phase-locked loop. In addition the second signal path is completely incorporated in the first phase-locked loop and makes it possible to simplify the form of realising the receiver and to symmetrise it to a considerable extent.

A further preferred embodiment ensuring a correct phase quadrature relation or phase orthogonality between the two auxiliary mixing carriers is characterized in that the fixed oscillator circuit has a third phase-locked loop comprising a phase detector, a loop filter and a controllable auxiliary oscillator and a further controllable auxiliary oscillator which is set at the same frequency as the first-mentioned controllable auxiliary oscillator a control input of which is coupled to an output of the loop filter for controlling its phase which is oppositely directed to the control of the phase of the first-mentioned auxiliary oscillator, and an output of which is coupled to the phase detector, said two auxiliary oscillators supplying said two auxiliary mixing carriers.

A further symmetry improvement is possible when the phase detectors arranged in the second and third phase-locked loops are symmetrically formed comprising first and second balanced, identical multiplier stages each having first, mutually corresponding inputs and second, mutually corresponding inputs, said first and second inputs of the first multiplier stage being coupled to the second and first inputs, respectively, of the second multiplier stage and to first and second inputs, respectively, of the phase detector, said multiplier stages being coupled to inputs of a superposition circuit an output of which is connected to the output of the phase detector.

BRIEF DESCRIPTION OF THE DRAWINGS

The invention will now be described in greater detail with reference to the accompanying drawings.

In these drawings.

DETAILED DESCRIPTION OF THE INVENTION

Figure 1:
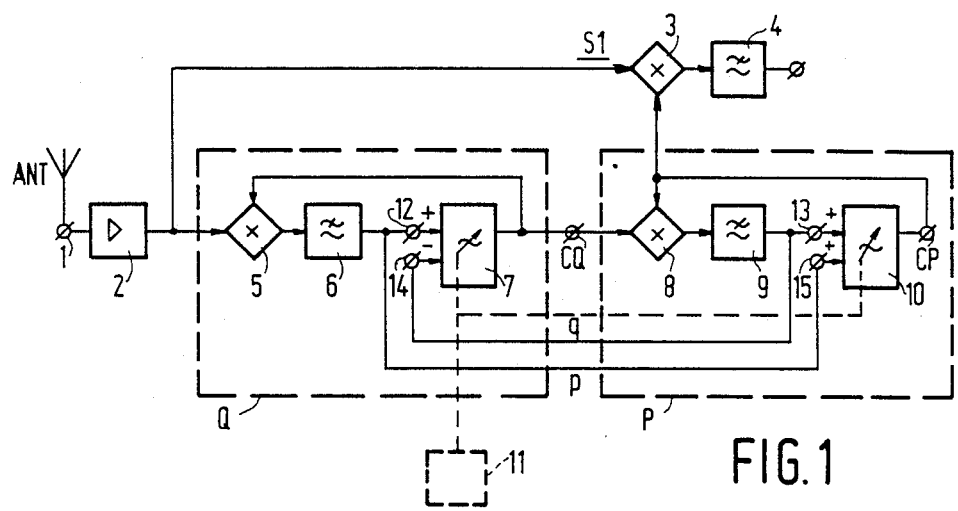
FIG. 1 shows a directly mixing synchronous receiver according to the invention.

FIG. 1 shows a directly mixing synchronous receiver according to the invention, having an RF input 1 to which an RF reception signal is applied from an antenna ANT and which is coupled to an RF input section 2 in which the RF reception signal is amplified and possibly selected. The RF input section 2 is coupled, on the one hand to a first signal path S1 incorporating a first synchronous demodulator 3, and a subsequent first low-pass filter 4 and, on the other hand, to a carrier regeneration circuit comprising a cascade arrangement of first and second phase-locked loops Q and P. The first and second phase-locked loops Q and P comprise in respective loop configurations, first and second phase detectors 5 and 8, first and second loop filters 6 and 9 and first and second voltage-controlled tuning oscillators 7 and 10, respectively. The operation of each of the two phase-locked loops Q and P is known per se.

The phase detector compares the phase of an input carrier with the phase of the oscillator signal and applies a phase control signal to the tuning oscillator via the loop filter. This phase control signal is zero when the two last-mentioned phases mutually differ by 90° and in its value and polarity it represents the magnitude and direction of deviations from this so-called phase-quadrature relation. These deviations are negatively fed back to the phase detector via the tuning oscillator. To this end the first and second loop filters 6 and 9 in the embodiment shown are coupled to non-inverting inputs 12 and 13 of the first and second tuning oscillators 7 and 10, respectively. Oscillator outputs CQ and CP of the first and second tuning oscillators 7 and 10 are connected, on the one hand, to the first and second phase detectors 5 and, 8 and on the other hand, to the second phase detector 8 and the first synchronous demodulator 3, respectively.

The tuning of the two tuning oscillators 7 and 10 is mutually coupled, that is to say, the frequencies of the oscillator signals of the two tuning oscillators are equal to each other and vary in a mutually equal direction and value when the tuning is operated from a tuning member 11. Since the oscillator signal of the first voltage-controlled tuning oscillator 7 constitutes an input carrier for the second phase-locked loop P, the phase of the oscillator signal of the second voltage-controlled tuning oscillator 10 is held accurately in a quadrature relation with respect to that of the first voltage-controlled tuning oscillator 7 in accordance with the afore-described operation and in case of a sufficient gain in this loop P.

An RF reception range, for example the TV frequency range of 40–960 MHz received at the antenna ANT, is amplified in the RF input section 2 and possibly filtered and applied to both the first synchronous demodulator 3 and the first phase detector 5 of the first phase-locked loop Q. The receiver is set at a desired RF reception signal within this RF reception range by means of operating the tuning of the two tuning oscillators 7 and 10, the oscillator frequency being set at the carrier of the desired RF reception signal or at least sufficiently close to it in order to cause at least the first phase-locked loop Q to pull in. In this correct tuning condition, the first tuning oscillator 7 applies an oscillator signal to the oscillator output CQ which due to the loop action differs accurately by 90° in phase with respect to the RF reception carrier. Since the oscillator signal of the second tuning oscillator 10, as already stated hereinbefore, differs by 90° accurately in phase with respect to that of the first tuning oscillator 7, the oscillator signal applied to the oscillator output CP is accurately in phase or in anti-phase with the RF reception carrier.

The latter oscillator signal is applied as a local, so-called in-phase mixing carrier to the first synchronous demodulator 3 for a direct synchronous demodulation of the modulation signal which is AM-modulated on the RF reception carrier. This demodulated baseband modulation signal is selected in the first low-pass filter 4 and is available at its output for further signal processing and reproduction.

A further improvement of the mutual phase quadrature relation between the local oscillator signals at the oscillator outputs CQ and CP is obtained by means of a control signal path q from the output of the second loop filter 9 to an inverting control input 14 of the first tuning oscillator 7. The phase control signal of the second phase-locked loop P thereby reduces the phase differences deviating from the phase quadrature via a phase control of both the local in-phase oscillator signal and the local quadrature oscillator signal.

The capture behavior is further improved by means of a control signal path p from the output of the first loop filter 6 to a non-inverting control input 15 of the second tuning oscillator 10. The phase control signal of the first loop filter 6 thereby realizes a phase-coupling of the local in-phase oscillator signal with the RF reception carrier via both the first and the second tuning oscillators 7 and 10.

Figure 2:
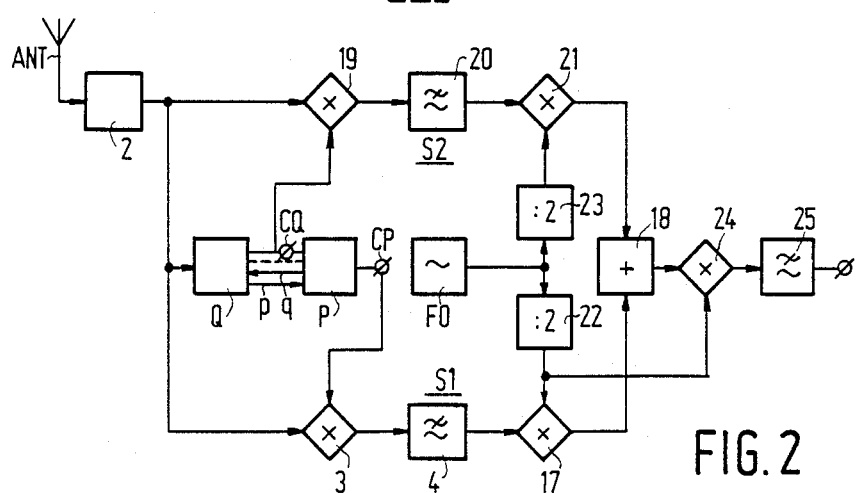
FIG. 2 shows a directly mixing synchronous receiver according to the invention having two parallel signal paths particularly suitable for the reception of TV signals.

FIG. 2 shows a directly mixing synchronous receiver according to the invention which is particularly suitable for the reception of TV signals in which the signals are demodulated analogously to the demodulation method as is known, for example from the afore-mentioned German Patent Application No. 2,657,170 laid open to public inspection. The circuits whose functions correspond to those of the receiver of FIG. 1 have the same reference designations.

In the embodiment shown the receiver is provided with a first modulator 17 arranged in the first signal path S1 behind the first low-pass filter 4, which modulator is coupled to a first input of a superposition circuit 18. The receiver is also provided with a second signal path S2 which is arranged parallel to the first signal path S1 and which has a further synchronous demodulator 19 which is coupled to the RF input section 2, a second low-pass filter 20 and a second modulator 21 which is connected to a second input of the superposition circuit 18. The oscillator signal at the oscillator output CQ of the first phase-locked loop Q is applied as a local quadrature mixing carrier to the further synchronous demodulator 19, while that of the phase-locked loop P, likewise as in the receiver of FIG. 1, is applied as an in-phase mixing carrier to the first synchronous detector 3 via the oscillator output CP. When tuning to a desired RF-TV reception signal, baseband TV signals which are mutually shifted by 90° with respect to each other are then obtained at the outputs of the first and the further synchronous demodulations 3 and 19. After selection in the first and second low-pass filters 4 and 20, these signals are applied to first and second modulators 17 and 21, respectively.

First and second auxiliary mixing signals which are in a mutual phase-quadrature are applied at a fixed frequency, preferably above the highest frequency in the baseband TV signal to these modulators 17 and 21 from a fixed oscillator FO via frequency dividers 22 and 23, respectively. Consequently the sum of two signals which are mirrored with respect to the fixed frequency is produced at the output of the modulator 17 and the difference is produced at the output of the modulator 21, or conversely. By means of a suitable superposition (mutually adding or subtracting) of the output signals of 17 and 21, a TV signal remodulated at the fixed frequency is obtained in a desired frequency location. The unwanted mirrored neighboring channels in the two latter output signals are then simultaneously compensated for.

Subsequently, the remodulated TV signal is demodulated in a second synchronous demodulator 24 to which, dependent on the choice of the last-mentioned desired frequency location, one of the two auxiliary mixing signals is applied as a mixing carrier (in the relevant example the first auxiliary mixing carrier). The desired baseband TV signal is obtained thereby. A third low-pass filter 25 for selection of the desired baseband TV signal is connected to the output of the second synchronous demodulator 24.

Figure 3:
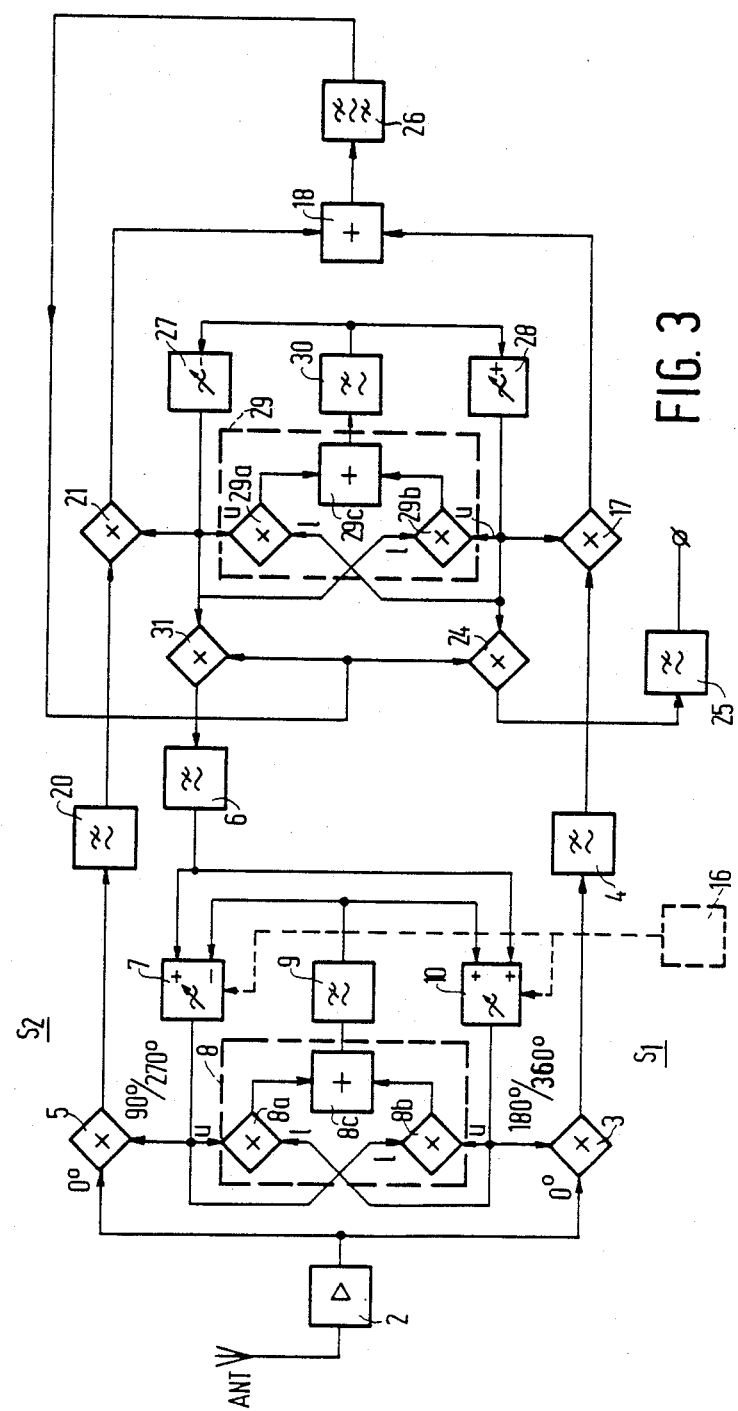
FIG. 3 shows an embodiment of a directly mixing synchronous receiver according to the invention which is particularly suitable for integration.

FIG. 3 shows a practical, integratable embodiment of a directly mixing synchronous receiver in which the signal demodulation method used in the receiver of FIG. 2 is realized in a substantially symmetrical circuit configuration. The circuits whose functions correspond to those of the circuits of the receivers of FIGS. 1 and 2 have the same reference designations.

In the receiver shown, the entire second signal path S2 forms part of the first phase-locked loop Q. The first phase detector 5 functions not only as a phase detector but also as a synchronous demodulator in the second signal path S2 so that the further synchronous demodulator 19 can be dispensed with. The output signal of the first phase detector 5 therefore not only includes the direct current phase information of the first phase-locked loop but also a baseband modulation signal which is in phase quadrature with respect to the baseband modulation signal at the output of the first synchronous demodulator 3. In this embodiment the first phase-locked loop Q comprises a bandpass filter 26 in the signal direction behind the superposition circuit 18 for a selection of the modulation signal remodulated in the first and second modulators 17 and 21 at the fixed frequency of the first and second auxiliary mixing carriers and the direct current phase information remodulated at this fixed frequency in the second modulator 21. The two auxiliary mixing carriers are supplied from the fixed oscillator circuit 27-30 which will be described hereinafter.

The latter remodulated modulation signal selected in the bandpass filter 26 is subsequently applied to the above-mentioned second synchronous demodulator 24. The first auxiliary mixing carrier is also applied to the second synchronous demodulator 24. To this end the mixing signal input of this second synchronous demodulator 24 is connected to that of the first modulator 17 and is coupled to the other output, not mentioned hereinbefore, of the fixed oscillator circuit 27-30. The desired baseband modulation signal is obtained thereby, which signal is available at the output of the receiver for further signal processing after selection in the third low-pass filter 25.

The direct current phase information remodulated at the fixed frequency in the modulator 21 is applied, after selection in the bandpass filter 26, to a third synchronous demodulator 31 in which the remodulated direct current phase information is demodulated to the baseban by means of the second auxiliary mixing carrier. To this end a mixing signal input of the third synchronous demodulator 31 is connected to the mixing signal input of the second modulator 21 and is coupled to one of the two outputs of the fixed oscillator circuit 27-30. An output of the third synchronous demodulator 31 is coupled to the first loop filter 6 for further selection of the direct current phase control signal for the first tuning oscillator 7 of the first phase-locked loop Q.

In the embodiment shown the bandpass filter 26 is not only used for selection of the desired modulation signal (for example, TV signal) to be demodulated in the second synchronous demodulator 24, but it is also arranged in the first phase-locked loop Q and therefore determines the loop selectivity, particularly together with the first loop filter 6. It stands to reason that in the case of a sufficiently high selectivity of the first loop filter 6, it can also be directly coupled to the output of the second low-pass filter 20 so that the third synchronous demodulator 31 can be dispensed with.

The fixed oscillator circuit 27-30 comprises a third phase-locked loop 28, 29, 30 incorporating in a loop configuration a phase detector 29, a controllable oscillator 28 and a loop filter 30. To obtain a negative feedback of the phase such that the controllable oscillator 28 follows a reference carrier applied to the phase detector 29 over 90° in phase, the phase control signal of the loop filter 30 is applied to a non-inverting control input of the controllable oscillator 28.

The reference carrier is supplied from a controllable reference oscillator 27 and due to the action of the phase-locked loop 28-30 it is already in accurate phase quadrature with the oscillator signal of the controllable oscillator 28. This phase quadrature relation is further improved by applying the phase control signal of the latter loop 28-30 to an inverting control input of the controllable reference oscillator 27.

In the relevant case the reference oscillator 27 applies the afore-mentioned second auxiliary mixing carrier to both the second modulator 21 and the third synchronous demodulator 31 and the oscillator 28 applies the afore-mentioned first auxiliary mixing carrier to both the first modulator 17 and the second synchronous demodulator 24.

Figure 4:
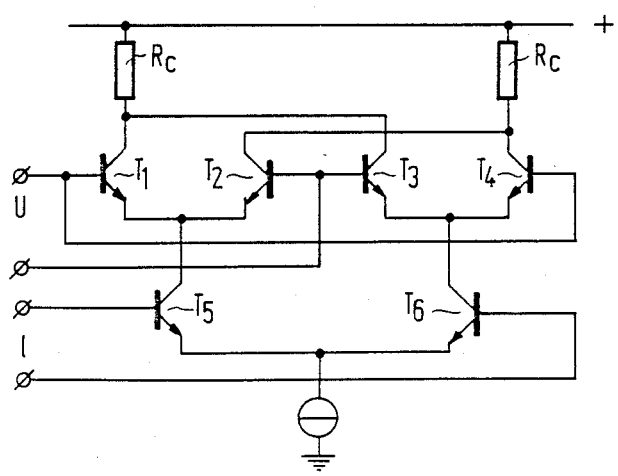
FIG. 4 shows a balanced embodiment of a multiplier circuit which can be used in the phase detectors of FIG. 3.

The circuit symmetry of the receiver is improved by subjecting the oscillators 7, 10 and 27, 28 to a mutually equal load. This is realized in the second phase detector 8 by means of two multiplier stages 8a and 8b having a mutually equal configuration as is shown by way of example in FIG. 4. The multiplier stage of FIG. 4 comprises in a so-called upper layer, emitter-coupled transistor pairs $T_1$, $T_2$ and $T_3$, $T_4$ and in a so-called lower layer, an emitter-coupled transistor pair $T_5$, $T_6$ which is connected to ground via an emitter current source. The bases of the transistors $T_2$ and $T_3$, and $T_1$ and $T_4$ are coupled together and constitute a first input U of the multiplier stage. The collectors of the transistors $T_1$ and $T_3$, and $T_2$ and $T_4$ are interconnected and are connected via common collector resistors $R_c$ to a supply voltage and constitute an output of the multiplier stage. The emitters of the transistor pairs $T_1$, $T_2$ and $T_3$, $T_4$ are connected to the collectors of transistors $T_5$ and $T_6$, respectively. The bases of the transistor pair $T_5$, $T_6$ constitute a second input 1 of the multiplier stage.

Each of the stages 8a and 8b produces a multiplicative mixing between the oscillator signals of the oscillators 7 and 10 and is coupled to the superposition circuit 8c for adding the mixing result. The superposition circuit 8c is coupled to the second loop filter 9 for selection of the phase control signal.

The oscillator 7 is coupled to the first input u of the multiplier stage 8a and to the second input 1 of the multiplier stage 8b, while the oscillator 10 is coupled to the first input u of the multiplier stage 8b and to the second input 1 of the multiplier stage 8a. The second phase detector 8 subjects the oscillators 7 and 10 to a mutually equal load because each of these oscillators "sees" an upper layer and a lower layer of the multiplier stages 8a and 8b. The circuit symmetry is further improved by realizing the first synchronous demodulator 3 and the first phase detector 5 in a mutually equal circuit configuration and providing them with mixing signals at corresponding inputs from the respective oscillators 7 and 10.

By symmetrizing the phase detector 29 of the fixed oscillator circuit 28-30 in a corresponding way, a mutually equal load of the oscillators 27 and 28 is obtained. To this end the phase detector 29 has two mutually equal multiplier stages 29a and 29b first inputs of which are coupled to outputs of oscillators 27 and 28 and second inputs of which are coupled to the outputs of the oscillators 28 and 27, respectively. Here again each of the oscillators 27 and 28 "sees" an upper layer and a lower layer of the multiplier stages 29a and 29b. In an embodiment of the first and second modulators 17 and 21 in a mutually equal circuit configuration and a respective connection from the oscillators 27 and 28 to mutually corresponding inputs of these modulators 17 and 21, the oscillators 27 and 28 are subjected to a mutually equal load and also this part of the receiver circuit is symmetrical. Outputs of the multiplier stages 29a and 29b are coupled to a superposition circuit 29c which supplies the phase control signal of the phase-locked loop 27-30 via the loop filter 30.

It will be evident to those skilled in the art that the inventive idea can be realized by means of a circuit which is different from the one shown. Thus it is readily possible, for example by a suitably chosen control characteristic of the tuning oscillator 7 and/or 10, to add the control signal of the second loop filter 9 to that of the first loop filter 6 before applying it to the tuning oscillator 7 and/or to subtract it from that of the first loop filter 6 before applying it to the tuning oscillator 10.

I claim:

1. A directly mixing synchronous receiver having an RF input and first signal path coupled thereto which incorporates a first synchronous demodulator and a first low-pass filter, said receiver further having a carrier regeneration circuit comprising a first phase-locked loop incorporating in a loop configuration a first phase detector a first loop filter and a first voltage-controlled tuning oscillator, an input of said first phase detector being coupled to the RF input and an output of said first voltage-controlled tuning oscillator being coupled to the first phase detector and to an input of the first synchronous demodulator via a phase-shift circuit for a direct demodulation of an RF reception signal to the frequency baseband, characterized in that the phase-shift circuit comprises a second phase-locked loop incorporating in a loop configuration a second phase detector a second loop filter and a second voltage-controlled tuning oscillator, an input of said second phase detector being coupled to said output of said first voltage-controlled tuning oscillator and an output of said second voltage-controlled tuning oscillator being coupled to another input of the second phase detector and to the input the first synchronous demodulator, the tuning of the first voltage-controlled tuning oscillator being coupled with that of the second voltage-controlled tuning oscillator.

2. A directly mixing synchronous receiver as claimed in claim 1, characterized in that an output of the second loop filter is coupled to a control input of the first voltage-controlled tuning oscillator for a phase control of the first tuning oscillator which is in opposite polarity to the phase control of the second tuning oscillator.

3. A directly mixing synchronous receiver as claimed in claim 1, characterized in that an output of the first loop filter is coupled to a control input of the second voltage-controlled tuning oscillator for a phase control of the second tuning oscillator which has the same polarity as the phase control of the first tuning oscillator.

4. A directly mixing synchronous receiver as claimed in claim 1, characterized in that said receiver comprises a second signal path in which said RF reception signal is directly quadrature-demodulated to the baseband by means of the oscillator signal of the first voltage-controlled tuning oscillator, and a subsequent selection in a second low-pass filter, said first and second low-pass filters being coupled to first and second modulators to which first and second auxiliary mixing carriers are applied, respectively, from a fixed oscillator circuit, the frequency of said carriers being higher than the highest frequency in the baseband modulation signal of the RF reception signal and the carriers being mutually in phase-quadrature, said two modulators being coupled to inputs of a superposition circuit for mutually adding or subtracting the output signals of the two modulators, said superposition circuit being coupled to a second synchronous demodulator to which one of said two auxiliary mixing carriers is applied, said second synchronous demodulator being connected to a baseband signal processing unit for applying the baseband modulation signal thereto.

5. A directly mixing synchronous receiver as claimed in claim 4, characterized in that the first phase detector is arranged in the second signal path for said direct quadrature demodulation of the RF reception signal to the baseband and is coupled via the second low-pass filter to the first loop filter.

6. A directly mixing synchronous receiver as claimed in claim 5, characterized in that a bandpass filter is arranged between the superposition circuit and the second synchronous demodulator, said bandpass filter being coupled to a third synchronous demodulator to which the second auxiliary mixing carrier is applied, said third synchronous demodulator being arranged in the first phase-locked loop and being coupled to the first loop filter thereof.

7. A directly mixing synchronous receiver as claimed in claim 4, characterized in that the fixed oscillator circuit has a third phase-locked loop comprising a third phase detector, a third loop filter, a first controllable auxiliary oscillator and a second controllable auxiliary oscillator which is set at the same frequency as the first controllable auxiliary oscillator, a control input of said second controllable auxiliary oscillator being coupled to an output of the third loop filter for controlling its phase which is in opposite polarity to the control of the phase of the first auxiliary oscillator, and an output of said second controllable auxiliary oscillator being coupled to an input of the third phase detector, said first and second auxiliary oscillators supplying the two auxiliary mixing carriers.

8. A directly mixing synchronous receiver as claimed in claim 7, characterized in that the second and third phase detectors arranged in the second and third phase-locked loops are symmetrical and each of said second and third phase detector comprises first and second balanced identical multiplier stages each having first, mutually corresponding inputs and second, mutually corresponding inputs, said first and second inputs of the first multiplier stage being coupled to the second and first inputs, respectively, of the second multiplier stage and to first and second inputs, respectively, of each of said second and third phase detectors, said multiplier stages in each of said second and third phase detectors being coupled to inputs of a superposition circuit an output of which is connected to the output of each of the second and third phase detectors.

* * * * *